United States Patent [19]
Yokoyama et al.

[11] Patent Number: 4,617,724
[45] Date of Patent: Oct. 21, 1986

[54] PROCESS FOR FABRICATING HETEROJUNCTION BIPOLAR TRANSISTOR WITH LOW BASE RESISTANCE

[75] Inventors: Naoki Yokoyama; Toshio Ohshima, both of Atsugi, Japan

[73] Assignee: Fujitsu Limited, Kawasaki, Japan

[21] Appl. No.: 781,787

[22] Filed: Sep. 30, 1985

Related U.S. Application Data

[63] Continuation-in-part of Ser. No. 620,091, Jun. 13, 1984, abandoned.

[30] Foreign Application Priority Data

Jun. 30, 1983 [JP] Japan .................................. 58-119097
Nov. 19, 1984 [JP] Japan .................................. 59-242414

[51] Int. Cl.$^4$ .......................................... H01L 21/265
[52] U.S. Cl. ................................ 29/576 B; 29/577 C; 29/590; 148/1.5; 148/175; 148/DIG. 10; 148/DIG. 84; 357/61; 357/91
[58] Field of Search .................. 29/576 B, 571, 577 C, 29/590; 148/175, 1.5, 187; 357/61, 91

[56] References Cited

FOREIGN PATENT DOCUMENTS 2436502 11/1980 France .

OTHER PUBLICATIONS

Electronic Letters, vol. 19, No. 10, May 1983, London, GB; D. L. Miller et al. "(GaAl)As/GaAs Heterojunction bipolar transistors with graded composition base", pp. 367, 368.
Electronics Letters, vol. 16, No. 1, Jan. 1980, Hitchin, GB; D. Ankri et al. "Design and evaluation of a planar GaAlAs-GaAs bipolar transistor", pp. 41, 42.
Japanese Journal of Applied Physics. Supplements, vol. 22, Supplement No. 22-1, 1983, Tokyo, JP; J. S. Harris et al. "Heterojunction bipolar transistors", pp. 375–380 * pp. 376–377, FIGS. 1, 2, 3B*.
Journal of Applied Physics, vol. 46, No. 5, May 1975, New York, USA; M. Konagai et al. "(GaAl)As-GaAs heterojunction transistors with high injection efficiency", pp. 2120–2124.
Proceedings of the IEEE, vol. 70, No. 1, Jan. 1982, New York, USA; H. Kroemer "Heterostructure bipolar transistors and integrated circuits", pp. 13–25.
Hayes et al. Electronics Letts. 19 (1983) 410.
Nakamura et al. IEEE-Trans. Electron Devices, 29 (1982) p. 591.

Primary Examiner—Upendra Roy
Attorney, Agent, or Firm—Staas & Halsey

[57] ABSTRACT

When the collector, base and emitter layers of a heterojunction bipolar transistor or a tunneling hot electron transistor are vertically stacked, the thickness of the base layer is preferably small so as to increase the current gain or switching speed. A thin base layer, however, has a disadvantage in that a space of the base layer between the actual base region and the base electrode makes the base resistance too large, decreasing current gain or switching speed, or is fully depleted due to interface states, making the transistor inoperable. This disadvantage is eliminated by forming a base contact region by doping in a region in alignment with the edge of an electrode so as to remove said space, that is, the base contact region is in contact with the actual base region.

74 Claims, 12 Drawing Figures 4,617,724

PROCESS FOR FABRICATING HETEROJUNCTION BIPOLAR TRANSISTOR WITH LOW BASE RESISTANCE

This application is a continuation in part application of patent application Ser. No. 620,091, filed June 13, 1984, abandoned.

BACKGROUND OF THE INVENTION

The present invention relates to a process for fabricating a transistor, more specifically, a heterojunction bipolar transistor and a tunneling hot electron transistor (HET).

Heterojunction bipolar transistors, in which the emitter bandgap is wider than the base bandgap, have the advantage of higher emitter efficiency since holes (minority carriers for the emitter) flowing from the base to emitter are blocked by the higher barrier in the valence band (cf. W. Shockley, U.S. Pat. No. 2,569,347). The wide bandgap emitter allows the base to be heavily doped without sacrificing emitter efficiency. However, the cutoff frequency is relatively low, normally, a few gigahertz.

A typical heterojunction bipolar transistor is fabricated, by sequentially forming on a substrate, a collector layer, a base layer, and an emitter layer. An emitter electrode is formed on the emitter layer. A base electrode is formed on the base layer, on the same side of the substrate as the emitter electrode near the emitter electrode. However, the base layer is extremely thin, for example, from 50 nm to 100 nm, formed by a process of molecular beam epitaxy (MBE) or metal organic cheemical vapor deposition (MOCVD). The distance from the base electrode or base contact region to the emitter electrode or emitter contact region is, for example, from 1 $\mu$m to 2 $\mu$m. As a result, the base resistance becomes high, which limits the cutoff frequency, usually to a few gigahertz.

Since the MOMOM (metal-oxide-metal-oxide-metal) hot electron device was proposed by C. A. Mead (Proc. IRE 48, 359 (1960)), considerable efforts have been made, with limited success; due to the difficulty in obtaining very-thin metal and oxide films with a high quality. A heterojunction hot electron device, proposed by M. Heiblum (Solid-St. Electron. 24, 343 (1981)), is now possible since recent progress in MBE or MOCVD technology has enabled the forming of high-quality, very-thin semiconductor films and well-controlled hetero-interfaces.

A typical tunneling hot electron transistor (HET) using heterojunctions, for example, GaAs/AlGaAs, is fabricated by sequentially forming on a substrate a collector layer, a collector-side potential barrier layer, a base layer, an emitter-side potential barrier layer, and an emitter layer. An emitter electrode is formed on the emitter layer. A base electrode is formed on the base layer, on the same side of the substrate as the emitter electrode, near the emitter electrode. In order to increase the current gain, the thickness of the base layer should be reduced. However, if the thickness of the base layer is reduced, part of the base layer between the emitter contact region and the base electrode may be fully depleted due to interface states existing there, greatly increasing the base resistance and thus making the operation of the transistor impossible.

SUMMARY OF THE INVENTION

The object of the present invention is to decrease the base resistance so as to reduce the thickness of the base layer in order to obtain a high cutoff frequency in a heterojunction bipolar transistor and a high current gain in a hot electron transistor.

According to one aspect of the present invention, there is provided a process for fabricating a heterojunction bipolar transistor, comprising the steps of: forming a collector layer on a substrate; forming a base layer on the collector layer; forming an emitter layer on the base layer, the emitter layer forming a heterojunction with the base layer and having a bandgap wider than that of the base layer; forming an emitter electrode on part of the emitter layer; carrying out doping of dopants into part of the emitter layer and the base layer, using the emitter layer as a mask, so as to form a base contact region of the same conductivity type as that of the base layer, in alignment with an edge of the emitter electrode and reaching the base layer; and, forming a base electrode on said base contact region.

According to another aspect of the present invention, there is provided a process for fabricating a heterojunction bipolar transistor, comprising the steps of: forming an emitter layer on a substrate; forming a base layer on the emitter layer, the base layer forming a heterojunction with the emitter layer and having a bandgap shallower than that of the emitter layer; forming a collector layer on the base layer; forming a collector electrode on part of the collector layer; carrying out doping of dopants into part of the collector layer and the base layer, using the collector layer as a mask, so as to form a base contact region of the same conductivity type as that of the base layer, in alignment with an edge of the collector electrode and reaching the base layer; and forming a base electrode on said base contact region.

According to a further aspect of the present invention, there is provided a process for fabricating a tunneling hot electron transistor, comprising the steps of: forming a collector layer on a substrate; forming a base layer on the collector layer; forming an emitter-side potential barrier layer on the base layer; forming an emitter layer on the emitter-side potential barrier layer; forming an emitter electrode on part of the emitter layer; carrying out doping of dopants into part of at least the base layer, using the emitter electrode as a mask, so as to form a base contact region of the same conductivity type as that of the base layer, in alignment with an edge of the emitter electrode and reaching the base layer; and forming a base electrode on said base contact region.

According to still another aspect of the present invention, there is provided a process for fabricating a tunneling hot electron transistor, comprising the steps of: forming an emitter layer on a substrate; forming an emitter-side potential barrier layer on the emitter layer; forming a base layer on the emitter-side potential barrier layer; forming a collector layer on the potential base layer; forming a collector electrode on part of the collector layer; carrying out doping of dopants into part of at least the base layer, using the collector electrode as a mask, so as to form a base contact region of the same conductivity type as that of the base layer, in alignment with an edge of the collector electrode and reaching the base layer; and forming a base electrode on said base contact region.

BRIEF DESCRIPTION OF THE DRAWINGS

The present invention will be described below with reference to the drawings, in which.

DESCRIPTION OF THE PREFERRED EMBODIMENTS

Figure 1:
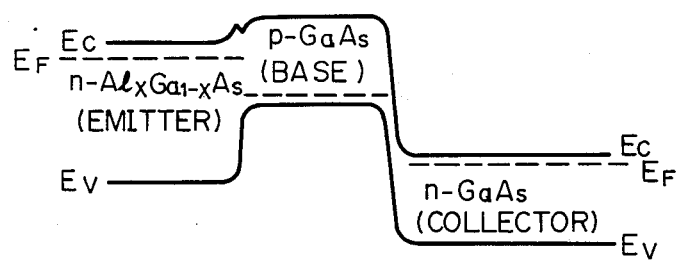
FIG. 1 is an energy-band diagram of an n-p-n heterojunction transistor.

FIG. 1 is an energy-band diagram of a heterojunction bipolar transistor with a wide bandgap emitter which comprises an n-type aluminum gallium arsenide ($Al_{x}Ga_{1-x}As$) emitter, p-type gallium arsenide (GaAs) base, and n-type GaAs collector.

In the diagram, $E_V$ represents the energy level of the top of the valence band, $E_C$ the energy level of the bottom of the conduction band, and $E_f$ the energy level of the Fermi level. In the figure, the bandgap of the emitter is wider than that of the base. This wide-bandgap-emitter heterojunction bipolar transistor has the advantage of higher emitter efficiency, since, while electrons (majority carriers for the emitter) easily flow from the emitter to the base over the low barrier in the conduction band, holes (minority carriers for the emitter) flowing from the base to emitter are blocked by the high barrier in the valence band.

Figure 2:
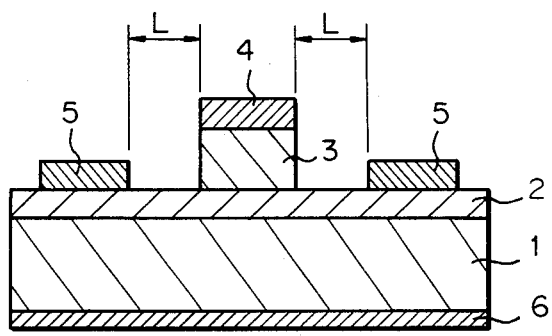
FIG. 2 is a sectional view of a prior art heterojunction transistor.

FIG. 2 shows a typical prior art heterojunction bipolar transistor. In the figure, 1 denotes an n-type GaAs collector, 2 a p-type GaAs base, 3 an n-type $Al_{x}Ga_{1-x}As$ emitter, 4 an emitter electrode, 5 a base electrode, and 6 a collector electrode. In the device, the base 2 has a small thickness of, for example, 50 nm to 100 nm, while the horizontal distance L between the base electrode 5 and the emitter electrode 4 or the emitter 3 is over approximately 1 μm. This results from the separate formation of the electrodes 4 and 5 and the mask alignment process used therefor. As a result, the base resistance becomes high, decreasing the cutoff frequency of the device.

Now, as mentioned in the summary of the invention, according to first aspect of the present invention, there is provided a process for fabricating a bipolar transistor comprising the steps of: forming a collector layer on a substrate; forming a base layer on the collector layer; forming an emitter layer on the base layer, the emitter layer forming a heterojunction with the base layer and having a bandgap wider than that of the base layer; forming an emitter electrode on part of the emitter layer; carrying out doping of dopants into part of the emitter layer and the base layer, using the emitter layer as a mask, so as to form a base contact region of the same conductivity type as that of the base layer, in alignment with the edge of the emitter electrode and reaching the base layer; and, forming a base electrode on the base contact region.

In this process, the base contact region, having a higher concentration of the doped impurity than that of the base layer, is formed in alignment with the emitter electrode by a self-alignment process. This allows a decrease in the base resistance and the emitter capacitance. This is made possible by the use, for the emitter electrode, of material which is heat resistant and allows ohmic contact with the semiconductor.

Annealing after ion implantation is conducted at about 600° C. to 1,000° C., for example, at 700° C. Annealing may be effected by flash annealing. According to the present invention, the material of the emitter electrode should withstand this annealing temperature and includes refractory metals such as tungsten, tantalum, titanium, molybdenum, vanadium, chromium, zirconium, niobium, and hafnium; silicides such as silicides of refractory metals as mentioned above, platinum silicide, palladium silicide, cobalt silicide, and nickel silicide; germanium; tellurium; silicon; thallium; cobalt; and nickel.

Examples of pairs of semiconductors, usually compound semiconductors, which may be used for the base and emitter layers are shown in Table 1.

The collector layer is usually made of the same semiconductor as that of the base layer, the doping conditions being different therebetween, since the layer need not form a heterojunction with the base layer.

TABLE 1

| Base layer | Emitter layer |
|---|---|
| GaAs | (AlGa)As |
| (InGa)As | InP |
| (InGa)As | (AlIn)As |
| (CaIn)Sb | AlSb |
| In(AsSb) | AlSb |
| GaAs | (GaIn)P |

However, the collector layer may also be a semiconductor which forms a heterojunction with the base layer and has a bandgap wider than that of the base layer and may be, for example, the same semiconductor as the emitter layer. In the latter case, a so-called double heterojunction bipolar transistor is formed. Furthermore, in a double heterojunction bipolar transistor, the collector layer may be used as an emitter and the emitter layer may be used as a collector. A device having an emitter layer under a base layer has a higher switching speed of the transistor than a device having an emitter layer on a base layer, since the former device has a smaller base-collector junction capacitor than the latter device due to a smaller-area base-collector junction in the former device.

In a process according to the present invention, the substrate may be of not only semi-insulating or insulating materials, for example, a nondoped compound semiconductor or silicon, or sapphire, but also of conductive materials, for example, a heavily doped compound semiconductor or silicon. Recently, it has been possible to make excellent compound semiconductors on a silicon or sapphire substrate by using a buffer layer therebetween.

An insulating or semi-insulating substrate may be used in the bipolar transistor by providing a collector electrode to the collector layer on the same side of the substrate as the base and emitter layers. A conductive substrate may be used in the bipolar transistor by providing a collector electrode to the collector layer, usually on the side of the substrate opposite to the base and emitter layers.

In the process according to the present invention, an emitter contact layer of the same conductivity type as that of the emitter layer with a higher carrier concentration, may be inserted between the emitter layer and the emitter electrode to improve ohmic contact therebetween. This emitter contact layer is preferably etched in the same form as that of the emitter electrode, since it is difficult to convert the conductivity type by doping dopants there.

A collector contact layer of the same conductivity type as that of the collector layer with a higher carrier concentration also may be inserted between the substrate and the collector layer, and the collector-electrode is formed in contact with the collector contact layer.

A buffer layer on the same conductivity type as that of the collector layer may be inserted between the substrate and the collector layer in order to improve the crystallographic characteristics of the first semiconductor layer.

A collector contact layer may act as a buffer layer.

The doping to form the base contact region in alignment with the emitter electrode may be conducted not only by ion implantation but also by heat diffusion.

FIGS. 3 to 6 illustrate the steps of fabricating a heterojunction bipolar transistor according to a specific embodiment of the first aspect of the present invention.

Figure 3:
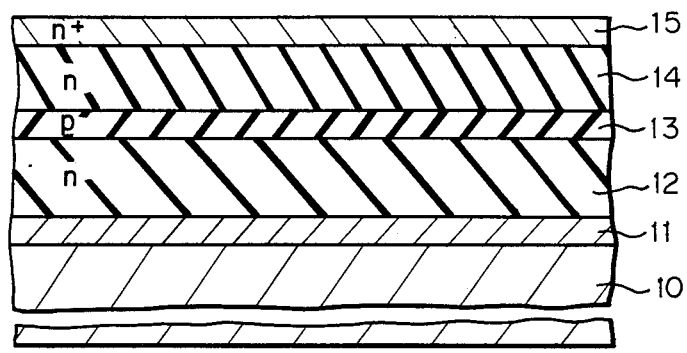
FIG. 3 to FIG. 6 are sectional views of a heterojunction transistor in the sequential steps of a process according to an embodiment of the present invention.

In FIG. 3, on a semi-insulating GaAs substrate 10, an n+-type GaAs buffer layer 11 having a doped impurity concentration of $1 \times 10^{\sim} \text{cm}^{-3}$ is formed in a thickness of 200 nm. An n-type GaAs collector layer 12 having a doped impurity concentration of $1 \times 10^{17}$ cm$^{-3}$ is formed in a thickness of 400 nm on the n-type GaAs collector layer 12. A p-type GaAs base layer 13 having a doped impurity concentration of $1 \times 10^{19}$ cm$^{-3}$ is formed in a thickness of 100 nm on the n-type GaAs collector layer 12. An n-type Al$_{0.3}$Ga$_{0.7}$As emitter layer 14 having a doped impurity concentration of $1 \times 10^{17}$ cm$^{-3}$ is formed in a thickness of 300 nm on the p-type GaAs base layer 13. Finally, an n+-type GaAs emitter contact layer 15 having a doped impurity concentration of $2 \times 10^{18}$ cm$^{-3}$ is formed in a thickness of 100 nm on the n-type Al$_{0.3}$Ga$_{0.7}$As emitter layer 14. These layers 11 to 15 are continuously formed by molecular beam epitaxy (MBE).

The bandgaps of the p+type GaAs p-type GaAs base layer 13 and the n-type Al$_{0.3}$Ga$_{0.7}$As emitter layer 14 are 1.4 eV and 1.8 eV, respectively.

With respect to the buffer layer 11, alternatively, a super lattice layer can be used for improving the crystallographic characteristics of the first semiconductor layer 12.

Figure 4:
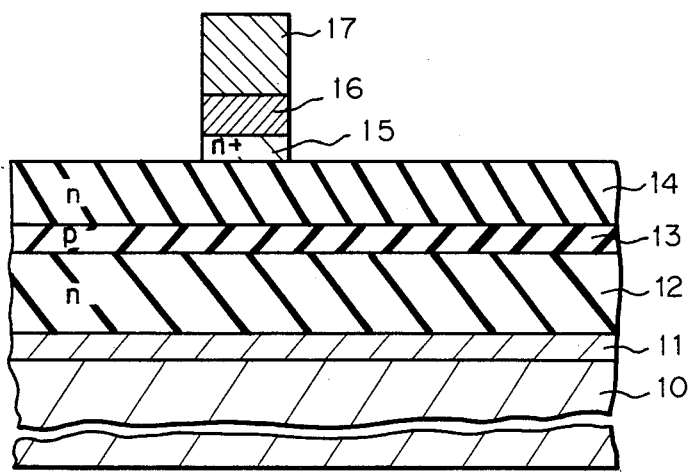

In FIG. 4, a germanium (Ge) layer 16 of a thickness of 20 nm and a tungsten silicide (W$_5$Si$_3$) layer 17 of a thickness of 500 nm are deposited on the n+-type GaAs emitter contact layer 15 and patterned to form an emitter electrode of a desired form by photolithography. The n+-type GaAs layer 15 is selectively etched with the emitter electrodes 16 and 17 as a mask. The etched n+-type GaAs layer 15 has the same pattern as that of the emitter electrode 17. Then, by annealing at 700° C. for 10 minutes, ohmic contact between the emitter electrode and the n+-type GaAs layer is formed.

Figure 5:
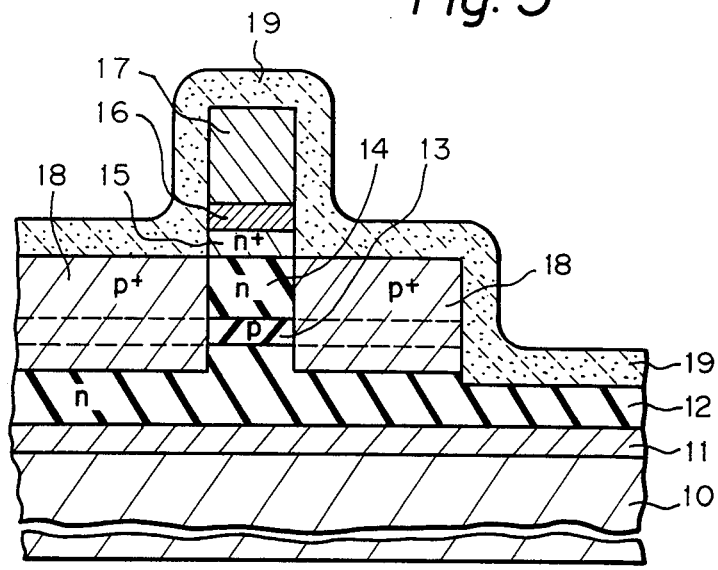

In FIG. 5, beryllium ions (Be+) are ion-implanted into or through the n-type Al$_{0.3}$Ga$_{0.7}$As emitter layer 14 with the emitter electrode 17 as a mask at an electron acceleration energy of 150 keV in a dose of $1 \times 10^{14}$ cm$^{-2}$. Selective etching is conducted in an area separated from the emitter electrode 17 where a collector electrode is to be formed. This selective etching is conducted at least until the n-type GaAs collector layer 12 is exposed. Then, a silicon dioxide (SiO$_2$) layer 19 is formed over the emitter electrodes 16 and 17, the n-type Al$_{0.3}$Ga$_{0.7}$As emitter layer 14, and the n-type GaAs collector layer 12, and heat treatment is conducted to anneal the implanted Be ions. This heat treatment is conducted at 700° C. for 20 minutes. Alternatively, the heat treatment may be conducted by flash annealing over, for example, 5 seconds using, for example, a halogen lamp.

After this annealing, the ion-implanted portion of the n-type Al$_{0.3}$Ga$_{0.7}$As emitter layer 14 and the upper part of the n-type GaAs collector layer 12 are changed to a p+-type base contact region 18 including the p-type GaAs base layer 13 except the actual base region under the emitter electrode 17. This p+-type base contact region 18 has a higher concentration of the p-type doped impurity than that of the p-type base layer 13 and is formed in alignment with the emitter electrode 17 in accordance with the present invention. As a result, only the actual base region of the p-type GaAs base layer 13 has a small thickness of 100 nm so that the base resistance is decreased. The thus remaining n-type Al$_{0.3}$Ga$_{0.7}$As emitter layer 14 is surrounded by the p+-type base contact region 18 at the sides and by the p-type GaAs base layer 13 thereunder. The p-type GaAs base layer 13 having the same pattern and area as those of the n-type Al$_{0.3}$Ga$_{0.7}$As emitter layer 14. The n-type GaAs collector layer 12 exists under the p-type GaAs base layer 13. In this structure of a bipolar transistor, electrons in the n-type Al$_{0.3}$Ga$_{0.7}$As emitter layer 14 almost all flow through the p-type GaAs base layer 13 and almost never through the p+-type base contact region 18, i.e., a p+-type Al$_{0.3}$Ga$_{0.7}$As region surrounding the p-type GaAs base layer 13 since the conduction energy band is lower in the p-type GaAs base layer 13 than in the p+-type Al$_{0.3}$Ga$_{0.7}$As base contact region 18. As a result, almost all of the electrons in the n-type Al$_{0.3}$Ga$_{0.7}$As emitter layer 14 are used for operation of the bipolar transistor.

Figure 6:
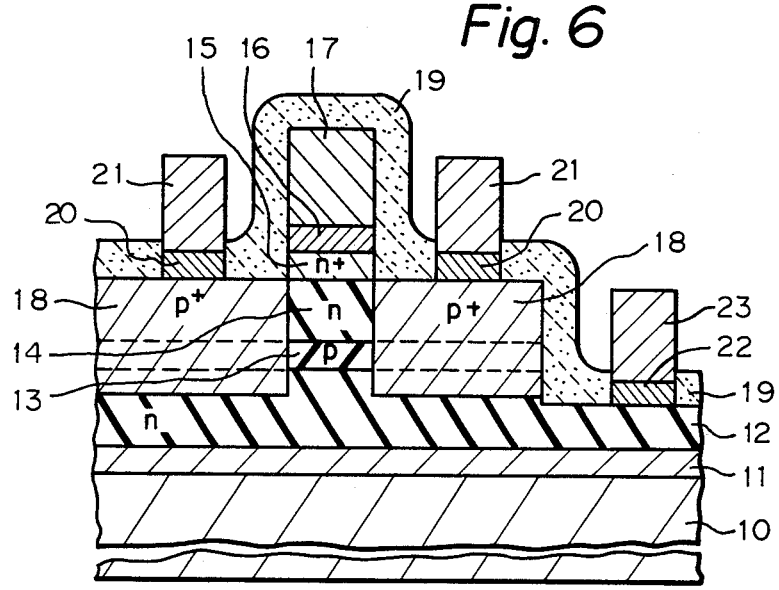

In FIG. 6, windows for base and collector electrodes 21 and 23 are opened in the silicon dioxide layer 19, and a zinc (Zn) layer 20 of a thickness of 20 nm and gold (Au) layer 21 of a thickness of 200 nm are deposited and patterned to form a base electrode and an AuGe layer 22 of a thickness of 30 nm and a gold (Au) layer 23 of a thickness of 200 nm are deposited and patterned to form a collector electrode in the before-formed electrode windows. Thus, a heterojunction bipolar transistor is fabricated.

In resultant heterojunction bipolar transistors, a current amplification coefficient h$_{FE}$ of 1500 and a cutoff frequency f$_t$ of 15 GHz are attained when the emitter size is 3 μm by 30 μm and h$_{FE}$ of 1500 and f$_t$ of 50 GHz when the emitter size is 1 μm by 30 μm.

In another embodiment of the first aspect of the present invention, a double heterojunction bipolar transistor can be fabricated easily by replacing the n-type GaAs collector layer 12 by an n-type Al$_{0.3}$Ga$_{0.7}$As layer. In such a double heterojunction bipolar transistor, either of the n-type Al$_{0.3}$Ga$_{0.7}$As emitter layer 14 or the n-type GaAs collector layer 12 replaced in this embodiment may be used as an emitter. That is to say, the emitter is not limited to the n-type Al$_{0.3}$Ga$_{0.7}$As emitter layer 14. In either case, the bipolar transistor is a heterojunction bipolar transistor with a wide bandgap emitter and the base has a lower resistance.

According to a second aspect of the present invention, as mentioned in the summary of the invention, there is also provided a process for fabricating a heterojunction bipolar transistor, comprising the steps of: forming an emitter layer on a substrate; forming a base layer on the emitter layer; the base layer forming a heterojunction with the emitter layer and having a bandgap shallower than that of the emitter layer; forming a collector layer on the base layer; forming a collector electrode on part of the collector layer; carrying out doping of dopants into part of the collector layer and the base layer, using the collector layer as a mask, so as to form a base contact region of the same conductivity type as that of the base layer, in alignment with an edge of the collector electrode and reaching the base layer; and, forming a base electrode on said base contact region.

This aspect of the invention relates to a reverse type heterojunction bipolar transistor in which an emitter layer exists under a base layer and a collector layer exists on the base layer. As a result, a heterojunction, if making a bandgap of the emitter layer wider than that of the collector layer, exists under the base layer between the emitter and base layer, not over the base layer as in the first aspect of the present invention. The other features of the second aspect of the present invention are substantially the same as those of the first aspect of the present invention and the descriptions of the first aspect of the present invention should be referred to for other details.

For example, in order to fabricate a reverse-type heterojunction bipolar transistor similar to the specific embodiment described-before with reference to FIGS. 3 to 6, it is sufficient that the layers 12 and 14 are replaced by an n-type $Al_{0.3}Ga_{0.7}As$ layer having a thickness of 300 nm and an n-type GaAs layer having a thickness of 10 nm, respectively.

Figure 7:
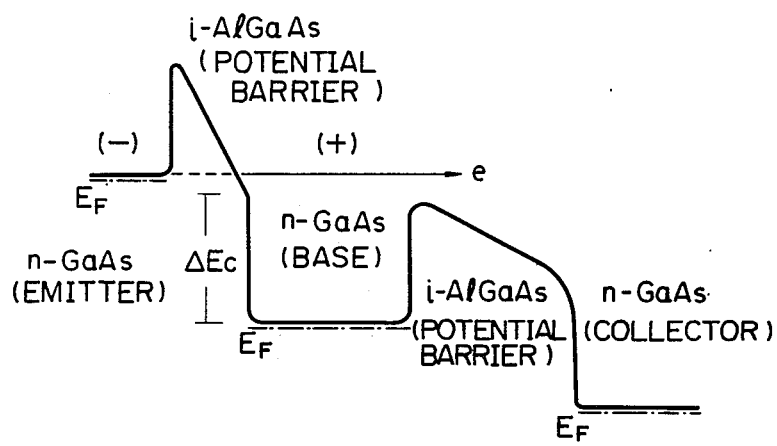
FIG. 7 is an energy-band diagram of an HET using a heterojunction of AlGaAs/GaAs.

FIG. 7 is an energy-band diagram of the bottom side of the conduction band of a hot electron transistor (HET) during operation, the HET comprising an n-type GaAs emitter, an i-type AlGaAs emitter-side potential barrier, an n-type GaAs base, an i-type AlGaAs collector-side potential barrier, and an n-type GaAs collector.

In the diagram, $E_F$ represents the energy level of the Fermi level, e a hot electron which has a tunneled through the AlGaAs emitter-side potential barrier, and $\Delta E_C$ the energy gap between the conduction bands of the AlGaAs and the GaAs.

In such a HET, if a bias voltage is applied between the collector and the emitter, and a voltage having a polarity of plus (+) on the side of the base and minus (−) on the side of the emitter, as shown in the figure, the decline of the emitter-side potential barrier becomes large and electrons are transmitted from the emitter to the base due to the tunneling effect. The transmitted electrons are hot, that is, have a high speed of movement and are transported to the collector.

Figure 8:
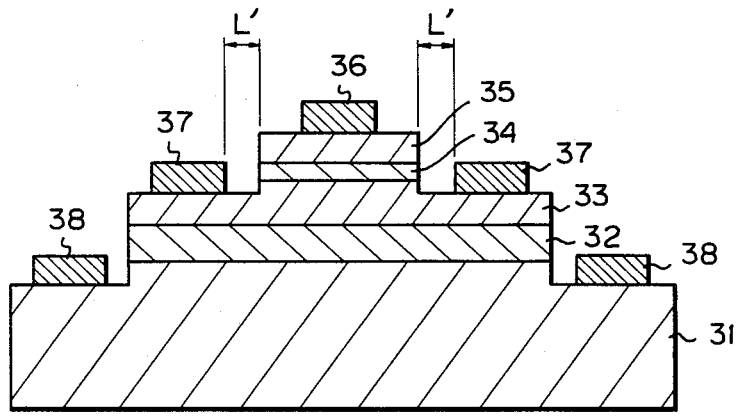
FIG. 8 is a sectional view of a prior art HET.

FIG. 8 shows a typical prior art HET. In the figure, 31 denotes an n-type GaAs collector, 32 an i-type $Al_xGa_{1-x}As$ collector-side potential barrier, 33 an n-type GaAs base, 34 an i-type $Al_xGa_{1-x}As$ emitter-side potential barrier, 35 an n-type GaAs emitter, 36 an emitter electrode, 37 a base electrode and 38 a collector electrode. In the device, there is a space L' in the base 33 between the emitter junction portion and the base electrode 37 and, therefore, the space is fully depleted due to the interface states there if the base 33 is made thin, which makes the transistor inoperable.

According to a third aspect of the present invention, as mentioned in the summary of the invention, there is provided a process for fabricating a tunneling hot electron transistor, comprising the steps of: forming a collector layer on a substrate; forming a base layer on the collector layer; forming an emitter-side potential barrier layer on the base layer; forming an emitter layer on the emitter-side potential barrier layer; forming an emitter electrode on part of the emitter layer; carrying out doping of dopants into part of at least the base layer, using the emitter electrode as a mask, so as to form a base contact region of the same conductivity type as that of the base layer, in alignment with an edge of the emitter electrode and reaching the base layer; and, forming a base electrode on said base contact region.

In this process, the base contact region having the same conductivity type as that of the base layer and a higher concentration of the doped impurity than that of the base layer is formed in alignment with the emitter electrode by a self-alignment process. This base contact region made by a self-alignment procedure allows the prevention of occurrence of full depletion of a portion of the base between the actual base portion and the base electrode or the base contact region, making the transistor operable even if the base is made thin.

The self alignment procedures of forming the base contact region in alignment with the emitter electrode are similar to those in the first and second aspects of the present invention and their descriptions should be referred to for details thereof.

In a HET, the emitter-side potential barrier layer should be a potential barrier for electrons, carriers, in the emitter layer, during operation, while electrons should be able to tunnel through the emitter-side potential barrier layer upon application of voltage between the emitter and base layers. Further, electrons which have tunnelled through the emitter-side potential barrier layer should be hot in the base region and transported to the collector layer as hot electrons. In such a HET, the conductivity type of the emitter-base-collector layers may be typicaly n-n-n, n-p-n, n-n-p, or n-p-p type. Further, they may be p-p-p, p-n-p, p-n-n, or p-p-n, and these devices should be called "hot hole transistors" in the strict sense of the term. In this specification including claims, however, the word "HET" should be considered to include the latter devices having a p-type emitter. Here, if the base and collector layers have the same conductivity type, another potential barrier layer, i.e., a collector-side potential barrier layer is necessary between the base and collector layers in order to isolate those layers. An emitter-side potential barrier layer will usually be an intrinsic layer, or may be a p-type layer, or even an n-type layer if the concentration of an n-type impurity in the potential barrier layer is considerably lower than that in the emitter layer. A collector-side potential barrier layer will usually be an intrinsic layer, or may be a layer having a conductivity type opposite to that of the base and collector layers. A heterojunction structure may be preferably used in forming a potential barrier. The combination of semiconductors shown in Table 1 can be used for making a heterojunction in a HET.

If the base layer has the same conductivity type as that of the emitter layer, part of the emitter layer and optionally the emitter-side potential barrier layer outside the emitter electrode should be removed so that the emitter and base layers are isolated when the base contact impurity-doped region is formed in the emitter-side potential barrier layer and the base layer in alignment with the edge of the emitter electrode. In order to ensure complete electrical separation between the emitter and base layers, part of the emitter layer under the emitter electrode may be side-etched toward the inside thereof when the part of the emitter layer outside the emitter electrode is etched by using the emitter electrode as the mask, and the ion implantion of forming the base contact region is carried out using the emitter electrode as the mask; or, the side surface of the emitter layer, part of which is removed outside the emitter electrode, may be insulated or provided with an insulating layer thereon. Alternatively, removal of a part or all of the thickness of the emitter-side potential barrier layer outside the emitter electrode may be done in order to ensure the complete electrical separation between the emitter and base layers.

If the base layer has the opposite conductivity type to that of the emitter layer, removal of part of the emitter layer, as mentioned above, is not necessary.

FIGS. 9 to 12 illustrate the steps of fabricating an HET according to a specific embodiment of the third aspect of the present invention.

Figure 9:
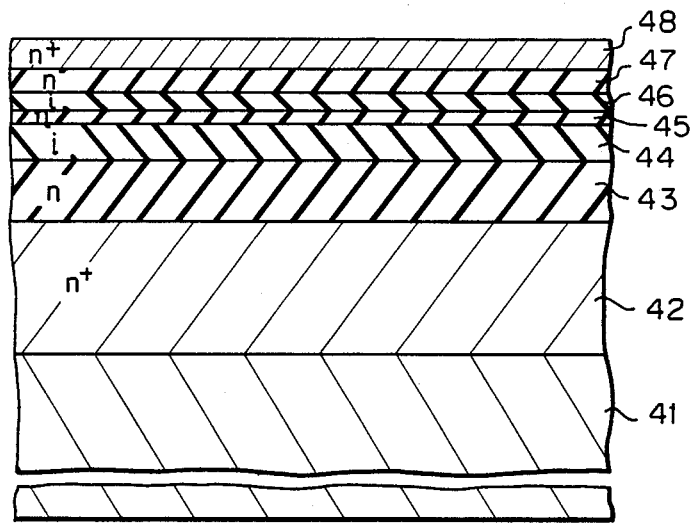
FIGS. 9 to 12 are sectional views of an HET in the sequential steps of a process according to an embodiment of the present invention.

In FIG. 9, 41 denotes a semi-insulating GaAs substrate, 42 an n+-type GaAs collector contact layer having a doped impurity concentration of $2 \times 10^{18}$ cm$^{-3}$ and a thickness of 500 nm, 43 a n-type GaAs collector layer having a doped impurity concentration of $5 \times 10^{17}$ cm$^{-3}$ and a thickness of 200 nm, 44 an i-type Al$_{0.3}$Ga$_{0.7}$As collector-side potential barrier layer having a thickness of 150 nm, 45 an n-type GaAs base layer having a doped impurity concentration of $5 \times 10^{15}$ cm$^{-3}$ and a thickness of 20 nm, 46 an i-type Al$_{0.3}$Ga$_{0.7}$As emitter-side potential barrier layer having a thickness of 50 nm, 47 an n-type GaAs emitter layer having a doped impurity concentration of $5 \times 10^{17}$ and a thickness of 50 nm, and 48 an n+-type GaAs emitter contact layer having a doped impurity concentration of $2 \times 10^{18}$ cm$^{-3}$ and a thickness of 100 nm. The layers 42 to 48 are continuously grown on the substrate 41 by MBE.

The energy barrier height of the i-type Al$_{0.3}$Ga$_{0.7}$As emitter-side potential barrier layer 46 in relation to the n-type GaAs emitter layer 47 is 0.3 eV.

The typical thickness of the base layer 43 in the prior art is 100 nm.

Figure 10:
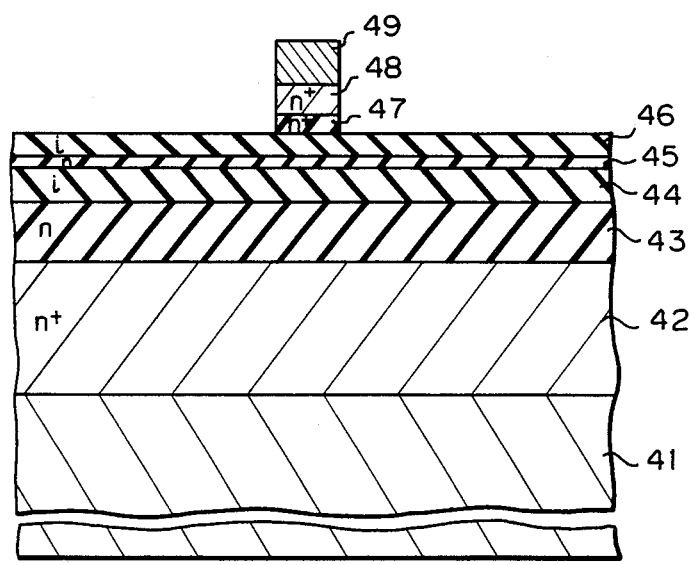

In FIG. 10, a layer 49 of a high melting material such as tungsten-system, molybdenum system or the like is deposited in a thickness of 200 nm by evaporation. The layer 49 is patterned by photolithography and chemical etching to form an emitter electrode 49. The emitter contact layer 48 and the emitter layer 47 are mesa dry-etched using the emitter electrode 49 as a mask to selectively expose the emitter potential barrier layer 46 in alignment with the edge of the emitter electrode 49, that is the etched emitter contact layer 48 and the etched emitter layer 47 have the same pattern as that of the emitter electrode 49.

Figure 11:
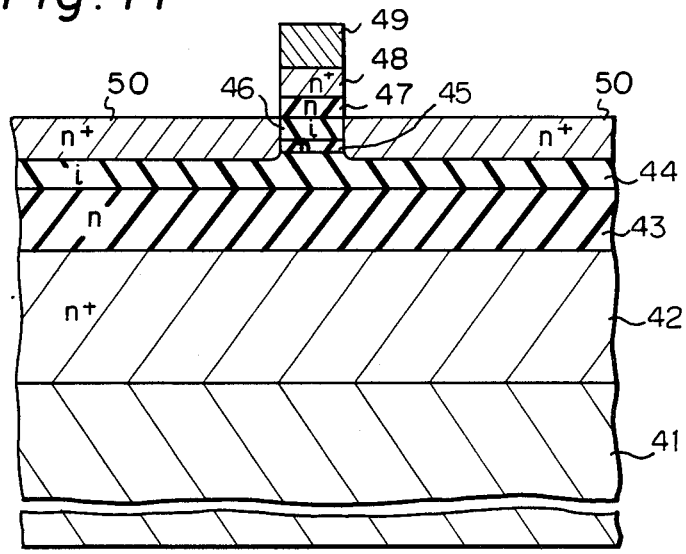

In FIG. 11, an aluminum nitride (AlN) film (not shown) as formed in a thickness of 50 nm on the emitter-side potential barrier layer 46 and the emitter electrode 49. Ion implantation is then carried out using ions selected from silicon (Si), selenium (Se), sulfur (S), tin (Sn) and the like and the emitter electrode 49 as a mask, at an electron acceleration energy of 150 keV in a dose of $10^{13}$ cm$^{-2}$, so as to form an n+-type base contact region 50 in alignment with the edge of the emitter electrode 49.

Then, heat treatment is carried out to activate the implanted ions. After this heat treatment, the base contact region 50 has a concentration of the doped impurity higher than that of the base layer 45 and a depth passing through the base layer 45 and reaching a part of the collector-side potential barrier layer 44 and an edge in alignment with the edge of the emitter electrode 49. Thus, the remaining portions of the base layer 45 and the emitter-side potential barrier layer 46 where the base contact region 50 is not formed have the same pattern as that of the emitter electrode 49 and therefore the patterned emitter layer 47, and are adjacent to the base contact region 50 without any space of the n-type base layer between the above-mentioned remaining portion of the base layer 45, i.e., the actual base portion, and the base contact region 50. That is to say there is no space at the n-type base layer which may be fully depleted and make the transistor inoperable.

Figure 12:
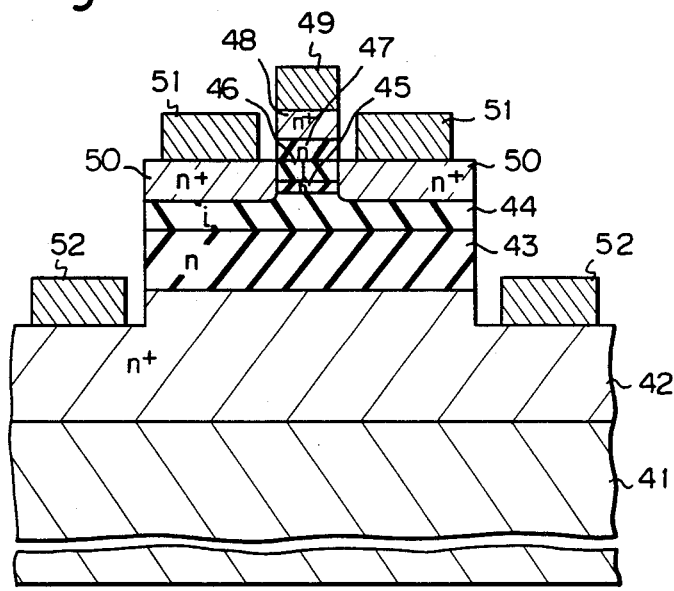

In FIG. 12, parts of the base contact region 50, or the emitter-side potential barrier layer 47 and the base layer 46, the collector-side potential barrier layer 43 and a partial depth of the collector contact layer 42 are mesa etched, with an area of the base contact region 50 remaining on which a base electrode is to be formed, so as to expose part of the collector contact layer 42 on which a collector electrode is to be formed.

AuGe/Au layers having a thickness of 20 nm and 200 nm respectively are deposited by evaporation and then patterned by photolithography and chemical etching, so as to form a base electrode 51 on the base contact region 50 and a collector electrode 52 on the collector contact region 42. Then, heat treatment is carried out to alloy the electrodes 51 and 52 with the contact region and layer 50 and 42 respectively.

In a resultant HET, the thickness of the base layer 44 may be reduced in relation to the case of a prior art HET, for example, from 100 nm to 20 nm, while expansion of a depletion layer in the base layer is prevented so that operation of transistor is possible, the base resistance is not decreased, and the current gain is increased.

In the above-mentioned specific embodiment, the n-type GaAs base layer 45 may be replaced by a p-type GaAs base layer and the i-type collector-side potential barrier layer 44 may be eliminated.

According to the fourth aspect of the present invention, there is provided a process for fabricating a HET, comprising the steps of: forming an emitter layer on a substrate; forming an emitter-side potential barrier layer on the emitter layer; forming a base layer on the emitter-side potential barrier layer; forming a collector layer on the base layer; forming a collector electrode on part of the collector layer; carrying out doping of dopants into part of at least the base layers, using the collector electrode as a mask, so as to form a base contact region of the same conductivity type as that of the base layer, in alignment with an edge of the collector electrode and reaching the base layer; and, forming a base electrode on the base contact region.

This aspect of the present invention relates to a reverse type of a HET in which an emitter layer, and thus an emitter-side potential barrier layer, exist under a base layer, and a collector layer, and thus a collector-side potential layer, exist on the base layer.

The features of the fourth aspect of the present invention are substantially the same as those of the third aspect of the present invention and the descriptions thereof should be referred to for details.

A specific embodiment of an HET according to the fourth aspect of the invention may be fabricated in a similar manner as in the above-mentioned embodiment in FIGS. 9 to 12, by simply changing the collector layer 43 and the emitter layer 47 with each other.

We claim:

1. A process for fabricating a heterojunction bipolar transistor, comprising the steps of:
   forming a collector layer on a substrate;
   forming a base layer on the collector layer;
   forming an emitter layer on the base layer, the emitter layer forming a heterojunction with the base layer and having a larger bandgap than that of the base layer;
   forming an emitter electrode on part of the emitter layer;
   carrying out doping of dopants into part of the emitter layer and the base layer, using the emitter layer as a mask, so as to form a base contact region in alignment with an edge of the emitter electrode and reaching the base layer; and
   forming a base electrode on said base contact region.

2. A process according to claim 1, wherein said doping is effected by ion implantation followed by heat treatment.

3. A process according to claim 1, wherein said emitter electrode is made from a heat resistant material.

4. A process according to claim 1, wherein said emitter electrode is made from one of the group of refractory metals, silicides, germanium, tellurium, silicon, cobalt, nickel, and thallium.

5. A process according to claim 1, wherein said collector layer has a bandgap wider than that of the base layer and forms a heterojunction with the base layer.

6. A process according to claim 1, wherein the collector, base and emitter layers are made of respective semiconductors.

7. a process according to claim 1, wherin the base and emitter layers are made of the combination of semiconductors selected from the group consisting of GaAs/(AlGaAs), (InGa)As/InP, (InGa)As/(AlIn)As, (GaIn)Sb/AlSb, In(AsSb)/AlSb and GaAs/(GaIn)P.

8. A process according to claim 1, further comprising the step of forming an emitter contact layer between the emitter layer and the emitter electrode, the emitter contact layer being patterned to the same pattern as that of the emitter electrode.

9. A process according to claim 1, further comprising the step of forming a buffer layer between the substrate and the collector layer.

10. A process according to claim 1, further comprising the step of forming a collector contact layer between the substrate and the collector layer.

11. A process according to claim 1, further comprising the step of forming a buffer layer between the substrate and the emitter layer.

12. A process according to claim 1, further comprising the step of forming an emitter contact layer between the substrate and the emitter layer.

13. A process according to claim 2, wherein said heat treatment is conducted at a temperature from 600° C. to 1000° C.

14. A process according to claim 2, wherein said heat treatment is flash annealing.

15. A process according to claim 4, wherein said refractory metal is tungsten, tantalum, molybdenum, titanium, vanadium, chromium, zirconium, niobium, or hafnium.

16. A process according to claim 5, wherein the base and emitter layers are made of a combination of respective semiconductors selected from the group consisting of (AlGaAs)/GaAs, InP/(InGa)As, (AlIn)As/(InGa)As, A2Sb/(GaIn)Sb, AlSb/In(AsSb) and (GaIn)P/GaAs.

17. A process according to claim 13, wherein said temperature is approximately 700° C.

18. A process for fabricating a heterojunction bipolar transistor comprising the steps of:
   forming an emitter layer on a substrate;
   forming a base layer on the emitter layer, the base layer forming a heterojunction withthe emitter layer and having a smaller bandgap than that of the emitter layer;
   forming a collector layer on the base layer;
   forming a collector electrode on part of the collector layer;
   carrying out doping of dopants into part of the collector layer and the base layer, using the collector layer as a mask, so as to form a base contact region in alignment with an edge of the collector electrode and reaching the base layer; and
   forming a base electrode on said base contact region.

19. A process according to claim 18, wherein said doping is effected by ion implantation followed by heat treatment.

20. A process according to claim 18, wherein said collector electrode is made from a heat resistant material.

21. A process according to claim 18, wherein said collector electrode is made from one of the group consisting of refractory metals, silicides, germanium, tellurium, silicon, cobalt, nickel, and thallium.

22. A process according to claim 18, wherein said collector layer is of a semiconductor having a larger bandgap than that of the base layer and forming a heterojunction with the base layer.

23. A process according to claim 18, wherein the emitter, base and collector layers are made of respective semiconductors.

24. A process according to claim 18, wherein the base layers are made of a combination of semiconductors selected from the group consisting of GaAs/(AlGaAs), (InP/(InGa)As, (AlIn)As/(InGa)As, AlSb/(GaIn)Sb, AlSb/In(AsSb) and (GaIn)P/GaAs.

25. A process according to claim 18, further comprising the step of forming a collector contact layer between the collector layer and the collector electrode, the collector contact layer being patterned to the same pattern as that of the collector electrode.

26. A process according to claim 19, wherein said heat treatment is conducted at a temperature from 600° C. to 1000° C.

27. A process according to claim 19, wherein said heat treatment is flash annealing.

28. A process according to claim 21, wherein said refractory metal is tungsten, tantalum, molybdenum, titanium, vanadium, chromium, zirconium, niobium, or hafnium.

29. A process according to claim 22, wherein the base and collector layers are made of the combination of respective semiconductors selected from the group consisting of (AlGaAs)/GaAs, (InGa)As/InP, (InGa)As/(AlIn)As, (GaIn)Sb/AlSb, In(AsSb)/AlSb and GaAs/(GaIn)P.

30. A process according to claim 26, wherein said temperature is approximately 700° C.

31. A process for fabricating a tunneling hot electron transistor, comprising the steps of:
  forming a collector layer on a substrate;
  forming a base layer on the collector layer;
  forming an emitter-side potential barrier layer on the base layer;
  forming an emitter layer on the emitter-side potential barrier layer;
  forming an emitter electrode on part of the emitter layer;
  carrying out doping of dopants into part of at least the base layer, using the emitter electrode as a mask, so as to form a base contact region in alignment with an edge of the emitter electrode and reaching the base layer; and
  forming a base electrode on said base contact region.

32. A process according to claim 31, wherein said doping is effected by ion implantation followed by heat treatment.

33. A process according to claim 31, wherein said first electrode is made from a heat resistant material.

34. A process according to claim 31, wherein said first electrode is made from one of the group consisting of refractory metals, silicides, germanium, tellurium, silicon, cobalt, nickel, and thallium.

35. A process according to claim 31, wherein said collector, base and emitter layers have the same conductivity type, said process further comprising the step of forming a collector-side potential barrier layer between the collector layer and the base layer.

36. A process according to claim 31, further comprising the step of etching part of the emitter layer, using the emitter electrode as a mask, so as to remove part of the emitter layer and selectively the emitter-side potential layer in alignment with the edge of the emitter electrode, followed by said doping to form said base contact region, so that the emitter layer and the base contact region are electrically isolated.

37. A process according to claim 31, wherein the base layer has the opposite conductivity type to that of the emitter layer and said doping is conducted into part of the emitter, emitter-side potential barrier and base layers, using the emitter electrode as a mask, so as to form said base contact region extending from the emitter layer to the base layer.

38. A process according to claim 31, wherein said emitter-side potential barrier layer is an intrinsic semiconductor layer.

39. A process according to claim 31, wherein said emitter-side potential barrier layer has the opposite conductivity type to that of the emitter layer.

40. A process according to claim 31, wherein said emitter-side potential barrier layer has the same conductivity type as that of the emitter layer.

41. A process according to claim 31, wherein (i) the collector, base and emitter layers and (ii) the emitter-side potential barrier layer are made of respective semiconductors of a combination selected from the group consisting of GaAs/(AlGaAs), (InGa)As/InP, (InGa)As/(AlIn)As, (GaIn)Sb/AlSb, In(AsSb)/AlSb and GaAs/(GaIn)P.

42. A process according to claim 31, further comprising the step of forming an emitter contact layer between the emitter layer and the emitter electrode, the emitter contact layer being patterned to the same pattern as that of the emitter electrode.

43. A process according to claim 31, further comprising the step of forming a buffer layer between the substrate and the collector layer.

44. A process according to claim 31, further comprising the step of forming a collector contact layer between the substrate and the collector layer.

45. A process according to claim 32, wherein said heat treatment is conducted at a temperature from 600° C. to 1000° C.

46. A process according to claim 32, wherein said heat treatment is flash annealing.

47. A process according to claim 34, wherein said refractory metal is tungsten, tantalum, molybdenum, titanium, vanadium, chromium, zirconium, niobium, or hafnium.

48. A process according to claim 25, wherein said collector-side potential barrier layer is an intrinsic semiconductor layer.

49. A process according to claim 35, wherein said collector-side potential barrier layer has the opposite conductivity type to that of the base and collector layers.

50. A process according to claim 35, wherein said collector-side potential barrier layer has the same conductivity type as that of the base and collector layers.

51. A process according to claim 35, wherein (i) the collector, base and emitter layers and (ii) the emitter-side and collector-side potential barrier layers are made of respective semiconductors of a combination selected from the group consisting of GaAs/(AlGaAs), (InGa)As/InP, (InGa)As/(AlIn)As, (GaIn)Sb/AlSb, In(AsSb)/AlSb and GaAs/(GaIn)P.

52. A process according to claim 45, wherein said temperature is approximately 700° C.

53. A process for fabricating a tunneling hot electron transistor, comprising the steps of:
  forming an emitter layer on a substrate;
  forming an emitter-side potential barrier layer on the emitter layer;
  forming a base layer on the emitter-side potential barrier layer;
  forming a collector layer on the base layer;
  forming a collector electrode on part of the collector layer;
  carrying out doping of dopants into part of at least the base layers, using the collector electrode as a mask, so as to form a base contact region in alignment with an edge of the collector electrode and reaching the base layer; and
  forming a base electrode on said base contact region.

54. A process according to claim 53, wherein said doping is effected by ion implantation followed by heat treatment.

55. A process according to claim 53, wherein said first electrode is made from a heat resistant material.

56. A process according to claim 53, wherein said first electrode is made from one of the group of refractory metals, silicides, germanium, tellurium, silicon, cobalt, nickel, and thallium.

57. A process according to claim 53, wherein the base layer has the opposite conductivity to that of the collector layer and said doping is conducted into part of the collector and base layers, using the collector electrode as a mask, so as to form said impurity-doped region extending from the collector layer to the base layer.

58. A process according to claim 53, wherein said emitter-side potential barrier layer is an intrinsic semiconductor layer.

59. A process according to claim 53, wherein said emitter-side potential barrier layer has the opposite conductivity type to that of the emitter layer.

60. A process according to claim 53, wherein said emitter-side potential barrier layer has the same conductivity type as that of the emitter layer.

61. A process according to claim 53, further comprising the step of forming a collector contact layer between the collector layer and the collector electrode, the collector contact layer being patterned to the same pattern as that of the collector electrode.

62. A process according to claim 53, further comprising the step of forming a buffer layer between the substrate and the emitter layer.

63. A process according to claim 53, further comprising the step of forming an emitter contact layer between the substrate and the emitter layer.

64. A process according to claim 54, wherein said heat treatment is conducted at a temperature from 600° C. to 1000° C.

65. A process according to claim 54, wherein said heat treatment is flash annealing.

66. A process according to claim 56, wherein said refractory metal is tungsten, tantalum, molybdenum, titanium, vanadium, chromium, zirconium, niobium, or hafnium.

67. A process according to claim 56, wherein said emitter, base and collector layers have the same conductivity type, said process further comprising the step of forming a collector-side potential barrier layer between the base layer and the collector layer.

68. A process according to claim 67, further comprising the step of etching part of the collector layer and selectively the collector-side potential barrier layer, using the collector electrode as a mask, to remove part of the collector layer and selectively the collector-side potential barrier layer in alignment with an edge of the collector electrode, followed by said doping to form said base contact region so that the collector layer and the base contact region are electrically isolated.

69. A process according to claim 67, wherein said collector-side potential barrier layer is an intrinsic semiconductor layer.

70. A process according to claim 67, wherein said collector-side potential barrier layer has the opposite conductivity type to that of the base and collector layers.

71. A process according to claim 67, wherein said collector-side potential barrier layer has the same conductivity type as that of the base and collector layers.

72. A process according to claim 67, wherein (i) the emitter, base and collector layers and (ii) the emitter-side potential barrier layer are made of respective semiconductors of a combination selected from the group consisting of GaAs/(AlGaAs), (InGa)As/InP, (InGa)As/(AlIn)As, (GaIn)Sb/AlSb, In(AsSb)/AlSb and GaAs/(GaIn)P.

73. A process according to claim 67, wherein (i) the emitter, base and collector layers and (ii) the emitter-side and collector-side potential barrier layers are made of respective semiconductors of a combination selected from the group consisting of GaAs/(AlGaAs), (InGa)As/InP, (InGa)As/(AlIn)As, (GaIn)Sb/AlSb, In(AsSb)/AlSb and GaAs/(GaIn)P.

74. A process according to claim 64, wherein said temperature is approximately 700° C.

* * * * *

UNITED STATES PATENT AND TRADEMARK OFFICE
CERTIFICATE OF CORRECTION

PATENT NO. : 4,617,724
DATED : Oct. 21, 1986
INVENTOR(S) : Yokoyama et al.

Page 1 of 2

It is certified that error appears in the above-identified patent and that said Letters Patent is hereby corrected as shown below:

Insert the following on
FRONT PAGE
[56] References Cited

U.S. Patent Documents

| | | | |
|---|---|---|---|
| 4,330,343 | 5/1982 | Christou et al. | 148/1.5 |
| 4,378,255 | 3/1983 | Holonyak, Jr. et al | 148/1.5 |
| 4,398,963 | 8/1983 | Stall et al. | 148/1.5 |
| 4,428,111 | 1/1984 | Swartz | 29/569E |
| 4,439,910 | 4/1984 | Vasudev | 29/569L |

Other Publications
Electronics Letters, vol. 16, (1980), 637, YUAN et al.
Electronics Letters, vol. 18, (1982), 533, VESCAN et al.
OHMIC CONTACTS, ANDERSON et al., Conf., March 1981, p. 39-42.
IEEE-Trans., Ind. Electronics, Vol. IE-19, May 1982,
     p. 149, ANDERSON et al.

Col. 5
Line 30, delete "$1 \times 10^{-3}$ cm" and insert --$1 \times 10^{18}$ cm$^{-3}$--.

UNITED STATES PATENT AND TRADEMARK OFFICE
CERTIFICATE OF CORRECTION

PATENT NO. : 4,617,724
DATED : Oct. 21, 1986
INVENTOR(S) : Yokoyama et al.

It is certified that error appears in the above-identified patent and that said Letters Patent is hereby corrected as shown below:

Col. 8
Line 42, "layer" should read --layer--.

Col. 12
*Line 15, delete "withthe" and insert --with the--.

Col. 14
Claim 48, line 1, delete "25" and insert --35--.

Signed and Sealed this

Third Day of March, 1987

Attest:

DONALD J. QUIGG

Attesting Officer

Commissioner of Patents and Trademarks